(12) United States Patent
Tseng

(10) Patent No.: US 8,730,636 B2
(45) Date of Patent: May 20, 2014

(54) ADAPTIVE PROTECTION CIRCUIT MODULE FOR OPERATIONAL AMPLIFIER AND ADAPTIVE PROTECTION METHOD THEREOF

(75) Inventor: Wei-Kai Tseng, Tainan (TW)

(73) Assignee: Himax Technologies Limited, Tainan (TW)

(*) Notice: Subject to any disclaimer, the term of this patent is extended or adjusted under 35 U.S.C. 154(b) by 125 days.

(21) Appl. No.: 13/480,117

(22) Filed: May 24, 2012

(65) Prior Publication Data
US 2013/0314835 A1 Nov. 28, 2013

(51) Int. Cl.
*H02H 5/04* (2006.01)
*H02H 9/08* (2006.01)

(52) U.S. Cl.
USPC ........................ 361/93.8; 361/93.9

(58) Field of Classification Search
USPC ............................... 361/93.8, 93.9
See application file for complete search history.

(56) References Cited

U.S. PATENT DOCUMENTS

2009/0052103 A1* 2/2009 Beny .................. 361/91.1
2009/0116160 A1* 5/2009 Fan et al. ............ 361/92

* cited by examiner

*Primary Examiner* — Scott Bauer
(74) *Attorney, Agent, or Firm* — J.C. Patents

(57) ABSTRACT

An adaptive protection circuit module for an operational amplifier including an over temperature protection circuit and an over current protection circuit is provided. The over temperature protection circuit provides a temperature protection function to power down the operational amplifier when an operating temperature of the operational amplifier increases higher than a first threshold temperature. The over current protection circuit provides a current protection function to limit an output current of the operational amplifier and adjusts the first threshold temperature to a second threshold temperature when the over current protection circuit is enabled. The second threshold temperature is lower than the first threshold temperature. After the first threshold temperature is adjusted to the second threshold temperature, the over temperature protection circuit powers down the operational amplifier when the operating temperature increases higher than the second threshold temperature. Furthermore, an adaptive protection method for the foregoing operational amplifier is also provided.

16 Claims, 8 Drawing Sheets

ADAPTIVE PROTECTION CIRCUIT MODULE FOR OPERATIONAL AMPLIFIER AND ADAPTIVE PROTECTION METHOD THEREOF

BACKGROUND OF THE INVENTION

1. Field of the Invention

The invention relates to a protection circuit and a protection method thereof, and more particularly to an adaptive protection circuit module for an operational amplifier and an adaptive protection method thereof.

2. Description of Related Art

In recent years, since an operational amplifier has characteristic of high input impedance, high loop gain, low output impedance, low common mode gain and high gain bandwidth, the operational amplifier has been broadly applied in various circuits, for example, in the amplifier circuit for processing the amplification of large signals or in the driving circuit for driving such as capacitive load. In addition, an operational amplifier must have high driving capacity (i.e., high current output) for some large current applications (for example, applied in the driving circuit for driving a display panel).

When the operational amplifier is packaged as a chip, during the validation check, the output terminal of the operational amplifier would be short-circuit to the power terminal or the ground terminal. At the time, an over current protection (OCP) and an over temperature protection (OTP) are able to protect the operational amplifier for normal operation. In regard to the over current protection, a large current induced in the output terminal of the operational amplifier may trigger an over current protection circuit. In regard to the over temperature protection, once an operation temperature of the operational amplifier increases higher than a threshold temperature, an over temperature protection circuit is enabled to power down the operational amplifier. The over current protection circuit and the over temperature protection circuit work independently in related art.

SUMMARY OF THE INVENTION

The invention is directed to an adaptive protection circuit module for an operational amplifier that the over current protection circuit may adjust a threshold temperature of the over temperature protection circuit.

The invention is directed to an adaptive protection method for an operational amplifier that a threshold temperature of the over temperature protection function may be adjustable.

The invention provides an adaptive protection circuit module for an operational amplifier. The adaptive protection circuit module includes an over temperature protection circuit and an over current protection circuit. The over temperature protection circuit provides a temperature protection function to power down the operational amplifier when an operating temperature of the operational amplifier increases higher than a first threshold temperature. The over current protection circuit provides a current protection function to limit an output current of the operational amplifier and adjusts the first threshold temperature to a second threshold temperature when the over current protection circuit is enabled. After the first threshold temperature is adjusted to the second threshold temperature, the over temperature protection circuit powers down the operational amplifier when the operating temperature of the operational amplifier increases higher than the second threshold temperature. The second threshold temperature is lower than the first threshold temperature.

In an embodiment of the invention, the over temperature protection circuit controls the operational amplifier to release from a power-down state when the operating temperature of the operational amplifier decreases lower than a third threshold temperature.

In an embodiment of the invention, the over temperature protection circuit includes a voltage generating circuit, a voltage divider unit, and a comparator unit. The voltage generating circuit provides a temperature sensitive voltage and a reference voltage. The temperature sensitive voltage changes along with the operating temperature, and the reference voltage is temperature insensitive. The voltage divider unit is coupled to the voltage generating circuit. The voltage divider unit divides the reference voltage into a first threshold voltage, a second threshold voltage, and a third threshold voltage. The comparator unit is coupled to the voltage generating circuit and the voltage divider unit. The comparator unit compares the temperature sensitive voltage with the first threshold voltage, the second threshold voltage, or the third threshold voltage. The comparator unit outputs a power-down signal to power down the operational amplifier based on a comparison result.

In an embodiment of the invention, the over temperature protection circuit further includes a switch module. The switch module is coupled between the voltage divider unit and the comparator unit. The switch module is controlled by the over current protection circuit and the power-down signal to select and output the first threshold voltage, the second threshold voltage, or the third threshold voltage to the comparator unit.

In an embodiment of the invention, the switch module is switched to select and output the first threshold voltage to the comparator unit when the operating temperature of the operational amplifier increases toward the first threshold temperature.

In an embodiment of the invention, the switch module is switched to select and output the second threshold voltage to the comparator unit when the operating temperature of the operational amplifier increases toward the second threshold temperature.

In an embodiment of the invention, the switch module is switched to select and output the third threshold voltage to the comparator unit when the operating temperature of the operational amplifier decreases toward the third threshold temperature.

In an embodiment of the invention, the temperature sensitive voltage has a negative temperature coefficient.

In an embodiment of the invention, the over temperature protection circuit keeps the operational amplifier in a power-down state until a power on sequence starts.

In an embodiment of the invention, the over temperature protection circuit controls the operational amplifier to release from the power-down state when the power on sequence starts.

In an embodiment of the invention, the over temperature protection circuit powers down the operational amplifier by a power down signal, and the over temperature protection circuit includes a latch unit to latch the power down signal.

In an embodiment of the invention, the adaptive protection circuit module further includes a power on reset circuit module. The power on reset circuit module provides a power on reset signal to reset the latch unit, so that the over temperature protection circuit controls the operational amplifier to release from the power-down state.

In an embodiment of the invention, the power on reset circuit module includes a start up circuit, a bandgap circuit, and a logic unit. The start up circuit provides a first reset voltage to serve as the power on reset signal at a first temperature. The bandgap circuit is coupled to the start up circuit. The bandgap circuit provides a second reset voltage to serve as the power on reset signal at a second temperature. The logic unit is coupled to the start up circuit and the bandgap circuit. The logic unit outputs the first reset voltage or the second reset voltage to serve as the power on reset signal.

In an embodiment of the invention, the second temperature is higher than the first temperature.

The invention provides an adaptive protection method for an operational amplifier. The adaptive protection method includes the following steps. A current protection function is provided to limit an output current of the operational amplifier. A temperature protection function is provided to power down the operational amplifier when an operating temperature of the operational amplifier increases higher than a first threshold temperature. The first threshold temperature is adjusted to a second threshold temperature when the over current protection function is enabled. The second threshold temperature is lower than the first threshold temperature. After the first threshold temperature is adjusted to the second threshold temperature, in the step of providing the temperature protection function, the operational amplifier is powered down when the operating temperature of the operational amplifier increases higher than the second threshold temperature.

In an embodiment of the invention, the adaptive protection method further includes a step of controlling the operational amplifier to release from a power-down state when the operating temperature of the operational amplifier decreases lower than a third threshold temperature.

In an embodiment of the invention, the adaptive protection method further includes a step of keeping the operational amplifier in a power-down state until a power on sequence starts.

In an embodiment of the invention, the adaptive protection method further comprising includes a step of controlling the operational amplifier to release from the power-down state when the power on sequence starts.

According to the above descriptions, the over current protection circuit adjusts the first threshold temperature to the second threshold temperature when the over current protection function is enabled. Accordingly, the over temperature protection circuit powers down the operational amplifier at a lower threshold temperature to provide a better temperature protection.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
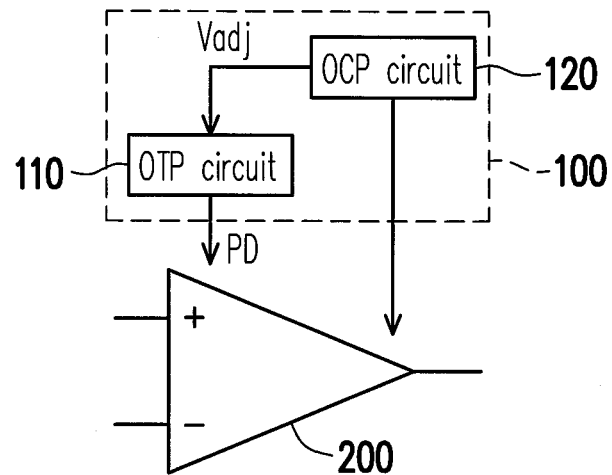
FIG. 1 illustrates a schematic diagram of an adaptive protection circuit module for an operational amplifier according to an embodiment of the invention.

FIG. 1 illustrates a schematic diagram of an adaptive protection circuit module for an operational amplifier according to an embodiment of the invention. Referring to FIG. 1, the adaptive protection circuit module 100 of the present embodiment is adapted for the operational amplifier 200 and includes an over temperature protection circuit 110 and an over current protection circuit 120. The over temperature protection circuit 110 provides a temperature protection function to power down the operational amplifier 200 by using a power down signal PD when an operating temperature of the operational amplifier 200 increases higher than a first threshold temperature. The over current protection circuit 120 provides a current protection function for the operational amplifier 200 by limiting an output current of the operational amplifier 200.

In the present embodiment, the over current protection circuit 120 further adjusts the first threshold temperature of the over temperature protection circuit 110 to a second threshold temperature by a control signal Vadj when the over current protection circuit 120 is enabled. After the first threshold temperature is adjusted to the second threshold temperature, the over temperature protection circuit 110 powers down the operational amplifier 200 when the operating temperature of the operational amplifier 200 increases higher than the second threshold temperature. Herein, the second threshold temperature is lower than the first threshold temperature. Accordingly, the over temperature protection circuit 110 powers down the operational amplifier 200 at a lower threshold temperature to provide a better temperature protection.

Figures 2A, 2B:
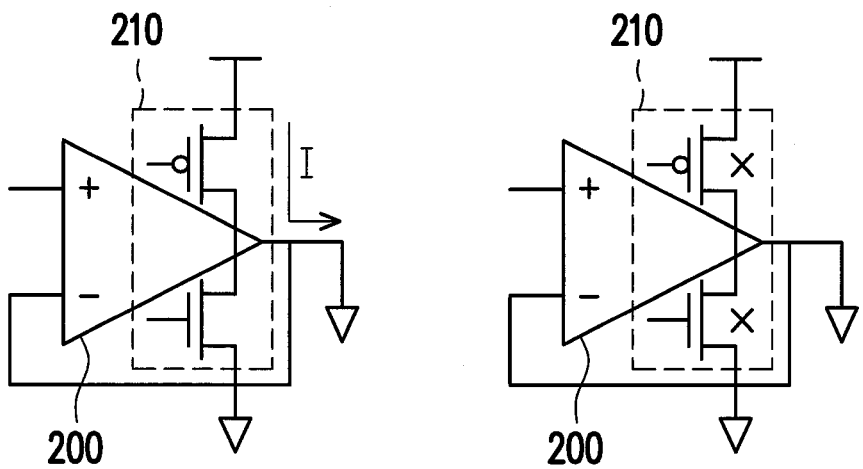
FIG. 2A and FIG. 2B respectively illustrate schematic diagrams of the operational amplifier 200 in the over current protection state and the over temperature protection according to an embodiment of the invention.

Specifically, FIG. 2A and FIG. 2B respectively illustrate schematic diagrams of the operational amplifier 200 in the over current protection state and the over temperature protection according to an embodiment of the invention. Referring to FIG. 1 to FIG. 2B, once the output terminal of the operational amplifier 200 is short-circuit to the power terminal or the ground terminal, a large output current I may occur at the output terminal. In FIG. 2A, the output terminal short-circuit to the ground terminal is exemplary, but the invention is not limited thereto. The large output current I may damage the operational amplifier 200 and increase the operating temperature of the operational amplifier 200. The over current protection circuit 120 first limits the output current I to a specific value to prevent the output current I from damaging the operational amplifier 200. Next, the operating temperature of the operational amplifier 200 may increase due to the large output current I. A high operating temperature would lower the metal current density inside the chip of the operational amplifier 200. Once the operating temperature of the operational amplifier 200 increases higher than the first threshold temperature or the second threshold temperature, the over temperature protection circuit 110 powers down the operational amplifier 200. When the operational amplifier 200 is powered down, the output stage 210 of the operational amplifier 200 stay in a high impedance state. It means that in this state the impedance seen from the output terminal of the operational amplifier 200 is quite high, and thus the output stage 210 conducts no current as shown in FIG. 2B. Accordingly, when the operational amplifier 200 is powered down, the operating temperature thereof gradually decreases as time goes on.

Figure 3A:
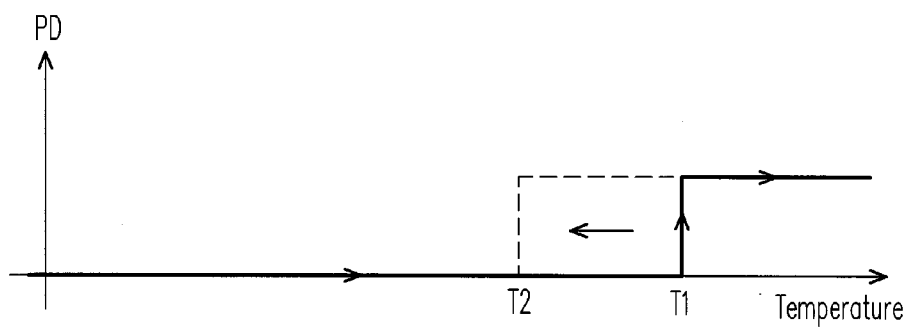
FIG. 3A and FIG. 3B respectively illustrate schematic waveforms of the power down signal PD changing along with the operating temperature of the operational amplifier 200 according to an embodiment of the invention.
Figure 3B:
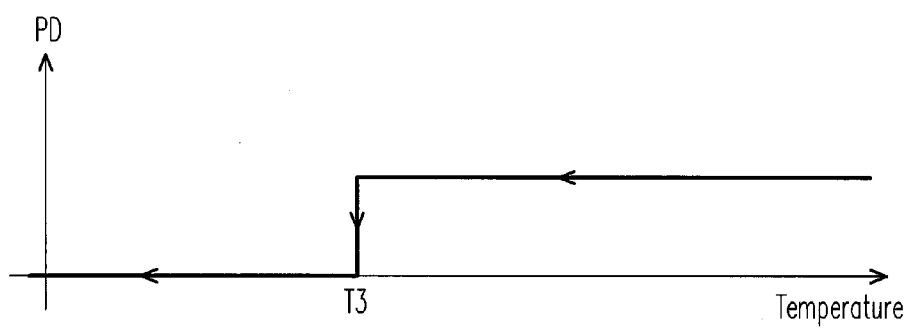

FIG. 3A and FIG. 3B respectively illustrate schematic waveforms of the power down signal PD changing along with the operating temperature of the operational amplifier 200 according to an embodiment of the invention. Referring to FIG. 1 and FIG. 3A to FIG. 3B, FIG. 3A shows the case that the operating temperature of the operational amplifier 200 is increasing. For this case, before the operating temperature increases higher than the first threshold temperature T1, the power down signal PD stays in a low level, and thus the over temperature protection function is disabled. It should be noted that the over current protection function is also disabled in this case, and the operational amplifier 200 works in the normal operation. The normal operation herein, for example, indicates an operation that the current protection function is not enabled. After the operating temperature increases higher than the first threshold temperature T1, the power down signal PD goes to a high level, and thus the over temperature protection function is enabled to power down the operational amplifier 200. A relatively low threshold temperature to enable the over temperature protection function may be better for protecting the operational amplifier 200. However, a too low threshold temperature may affect the normal operation of the operational amplifier 200 since the over temperature protection function is easily enabled due to noises or during reliability analysis. The threshold temperature to enable the over temperature protection function is adjustable in the present embodiment. For example, the threshold temperature to enable the over temperature protection function is set to the first threshold temperature T1 in the normal operation. By contrast, after the current protection function is enabled, the first threshold temperature T1 is adjusted to the second threshold temperature T2, and the second threshold temperature T2 is lower than the first threshold temperature T1. Under this condition, the over temperature protection circuit 110 powers down the operational amplifier 200 when the operating temperature of the operational amplifier 200 increases higher than the second threshold temperature T2. As shown in FIG. 3A, the power down signal PD goes to the high level at the second threshold temperature T2 to power down the operational amplifier 200 instead of the first threshold temperature T1.

On the other hand, FIG. 3B shows the case that the operating temperature of the operational amplifier 200 is decreasing. After the operational amplifier 200 is powered down, the operating temperature thereof gradually decreases as time goes on. The over temperature protection circuit 110 controls the operational amplifier 200 to release from the power-down state when the operating temperature of the operational amplifier 200 decreases lower than the third threshold temperature T3.

Figure 4:
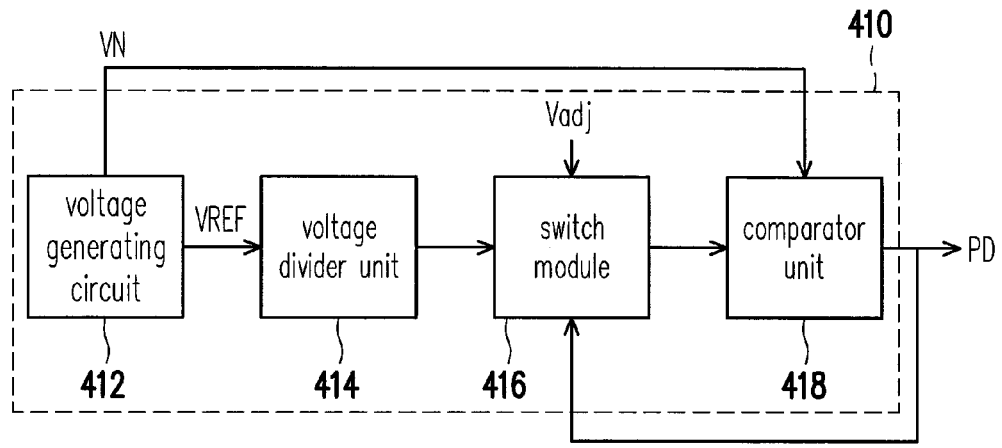
FIG. 4 illustrates a schematic block diagram of an over temperature protection circuit according to an embodiment of the invention.

FIG. 4 illustrates a schematic block diagram of an over temperature protection circuit according to an embodiment of the invention. Referring to FIG. 1 and FIG. 4, the over temperature protection circuit 410 includes a voltage generating circuit 412, a voltage divider unit 414, a switch module 416, and a comparator unit 418. The voltage generating circuit 412 provides a reference voltage VREF to the voltage divider unit 414 and a temperature sensitive voltage VN to the comparator unit 418. The temperature sensitive voltage VN changes along with the operating temperature of the operational amplifier 200, and the reference voltage VREF is temperature insensitive. The voltage divider unit 414 is coupled to the voltage generating circuit 412 for receiving the reference voltage VREF. The voltage divider unit 414 divides the reference voltage VREF into a first threshold voltage VTH1, a second threshold voltage VTH2, and a third threshold voltage VTH3 and outputs them to the switch module 416. The switch module 416 is coupled to the voltage divider unit 414 for receiving the first threshold voltage VTH1, the second threshold voltage VTH2, and the third threshold voltage VTH3. The switch module 416 is controlled by a control signal Vadj of the over current protection circuit and the power-down signal PD to select and output the first threshold voltage VTH1, the second threshold voltage VTH2, or the third threshold voltage VTH3 to the comparator unit 418. The comparator unit 418 is coupled to the voltage generating circuit 412 and the switch module 416. The comparator unit 418 compares the temperature sensitive voltage VN with the first threshold voltage VTH1, the second threshold voltage VTH2, or the third threshold voltage VTH3. The comparator unit 418 outputs the power-down signal PD to power down the operational amplifier based on a comparison result.

Figure 5:
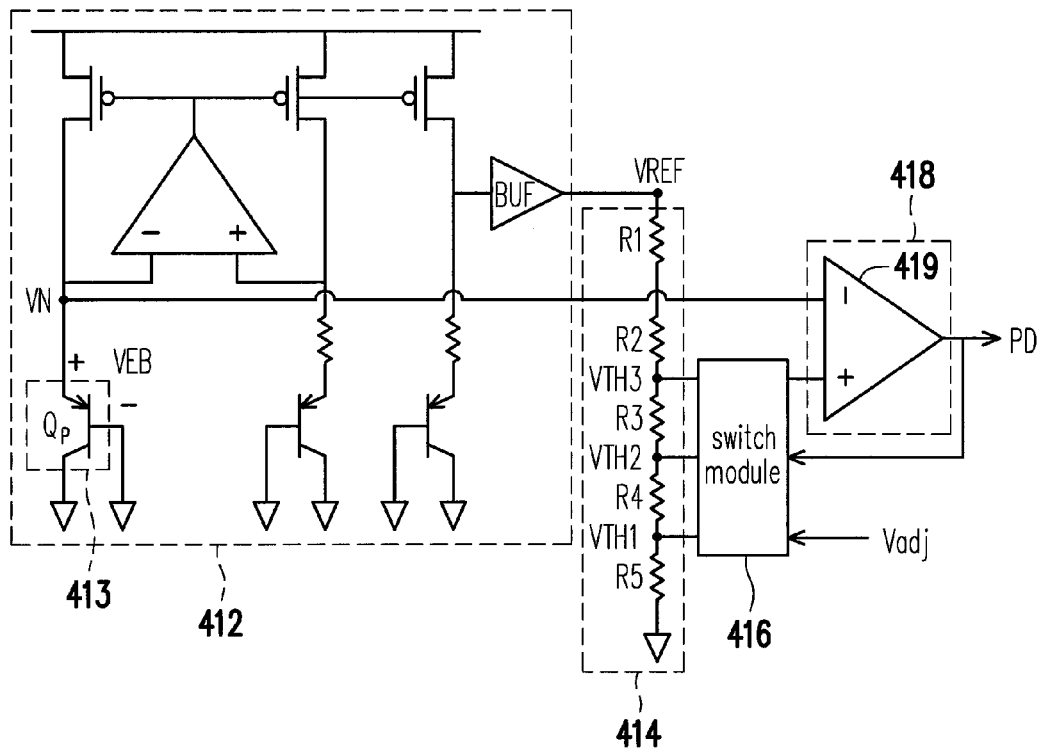
FIG. 5 illustrates a schematic circuit diagram of the over temperature protection circuit 410 shown in FIG. 4 according to an embodiment of the invention.

Specifically, FIG. 5 illustrates a schematic circuit diagram of the over temperature protection circuit 410 shown in FIG. 4 according to an embodiment of the invention. The voltage generating circuit 412 includes a temperature sensing part 413 for sensing the operating temperature of the operational amplifier 200. Herein, a PNP bipolar junction transistor (BJT) $Q_P$ is exemplary for temperature sensing part 413, but the invention is not limited thereto. The junction voltage $V_{EB}$ of the transistor $Q_P$ has a negative temperature coefficient and serves as the temperature sensitive voltage VN. The temperature sensitive voltage VN changes along with the operating temperature of the operational amplifier 200 and is outputted to the inverting terminal of the comparator unit 418. Furthermore, the voltage generating circuit 412 also outputs the reference voltage VREF to the voltage divider unit 414 through its output buffer BUF. The reference voltage VREF is temperature insensitive based on the circuit structure of the voltage generating circuit 412 in the present embodiment. The voltage divider unit 414 includes five resistors coupled in series between the first terminal and the second terminal thereof. The first terminal of the voltage divider unit 414 is coupled to the reference voltage VREF, and the second terminal of the voltage divider unit 414 is coupled to a ground voltage. The number of the resistors coupled in series is five for example, and the invention is not limited thereto. The reference voltage VREF is divided into the first threshold voltage VTH1, the second threshold voltage VTH2, and the third threshold voltage VTH3. The first threshold voltage VTH1 is generated at the node that the resistors R4 and R5 are coupled. The second threshold voltage VTH2 is generated at the node that the resistors R3 and R4 are coupled. The third threshold voltage VTH3 is generated at the node that the resistors R2 and R3 are coupled. The first threshold voltage VTH1, the second threshold voltage VTH2, and the third threshold voltage VTH3 respectively corresponds to the first threshold temperature T1, the second threshold temperature T2, and the third threshold temperature T3.

Figure 6:
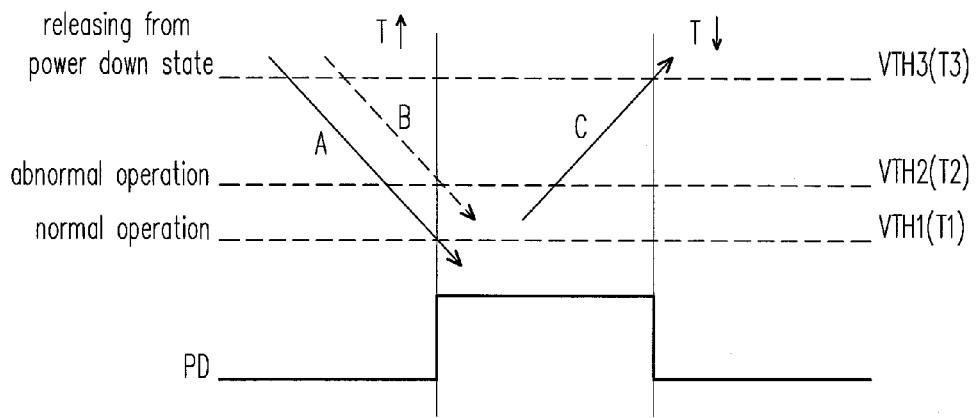
FIG. 6 illustrates a schematic waveform of the power down signal PD in different temperature according to an embodiment of the invention.

FIG. 6 illustrates a schematic waveform of the power down signal PD in different temperature according to an embodiment of the invention. Referring to FIG. 4 to FIG. 6, the operation modes of the operational amplifier 200 may be categorized into a normal operation and an abnormal operation. During the normal operation, the over current protection function is disabled, and the threshold temperature to enable the over temperature protection function is set to the first threshold temperature T1. The arrow A represents that the operating temperature T of the operational amplifier increases toward the first threshold temperature T1. In the meanwhile, the switch module 416 is switched to output the first threshold voltage VTH1 to the non-inverting terminal of the comparator unit 418 based on the control signal Vadj and the power down signal PD. Herein, the comparator unit 418 includes a comparator 419 for comparing the first threshold voltage VTH1 with the temperature sensitive voltage VN. Once the temperature sensitive voltage VN increases higher than the first threshold voltage VTH1 during the normal operation, the comparator 419 outputs a high power-down signal PD to power down the operational amplifier 200 based on the comparison result. That is to say, after the operating temperature T increases higher than the first threshold temperature T1, the power down signal PD goes to the high level, and thus the over temperature protection function is enabled to power down the operational amplifier 200.

During the abnormal operation, the over current protection function is enabled, and the threshold temperature to enable the over temperature protection function is adjusted to the second threshold temperature T2. The second threshold temperature T2 is lower than the first threshold temperature T1 in the present embodiment. The arrow B represents that the operating temperature T of the operational amplifier increases toward the second threshold temperature T2. The switch module 416 is switched to output the second threshold voltage VTH2 to the non-inverting terminal of the comparator 419 based on the control signal Vadj and the power down signal PD for comparing the second threshold voltage VTH2 with the temperature sensitive voltage VN. Once the temperature sensitive voltage VN increases higher than the second threshold voltage VTH2 during the abnormal operation, the comparator 419 outputs the high power-down signal PD to power down the operational amplifier 200 based on the comparison result. That is to say, after the operating temperature T increases higher than the second threshold temperature T2, the power down signal PD goes to the high level, and thus the over temperature protection function is enabled to power down the operational amplifier 200.

After the over temperature protection function is enabled to power down the operational amplifier 200, the power down signal PD may remain in the high level until the operating temperature T decreases lower than the third threshold temperature T3. In detail, no matter during the normal operation or during the abnormal operation, the threshold temperature to disable the over temperature protection function is adjusted to the third threshold temperature T3. The arrow C represents that the operating temperature T of the operational amplifier decreases toward the third threshold temperature T3. The switch module 416 is switched to output the third threshold voltage VTH3 to the non-inverting terminal of the comparator 419 based on the control signal Vadj and the power down signal PD for comparing the third threshold voltage VTH3 with the temperature sensitive voltage VN. Once the temperature sensitive voltage VN decreases lower than the third threshold voltage VTH3, the comparator 419 outputs a low power-down signal PD based on the comparison result, such that the operational amplifier 200 releases from a power-down state.

Figure 7:
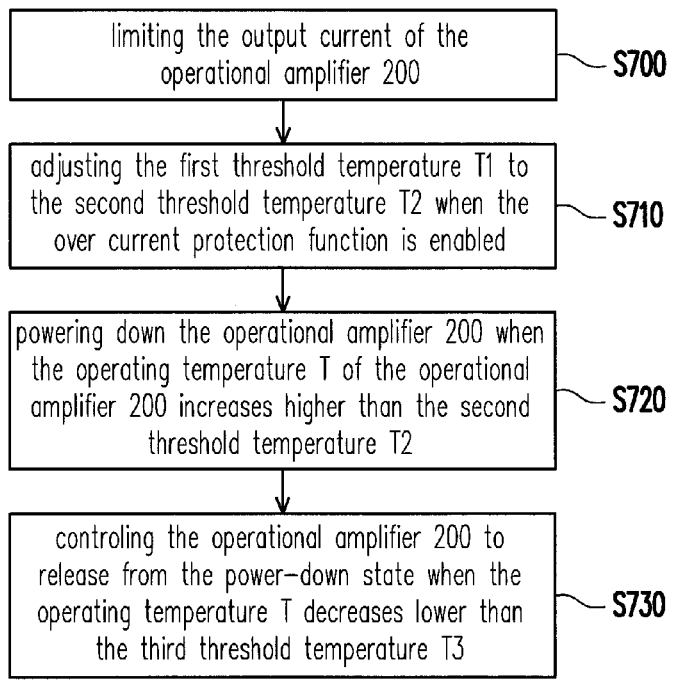
FIG. 7 illustrates a flowchart of an adaptive protection method for an operational amplifier according to an embodiment of the invention.

FIG. 7 illustrates a flowchart of an adaptive protection method for an operational amplifier according to an embodiment of the invention. Referring to FIG. 1 and FIG. 7, the adaptive protection method of the present embodiment may be adapted to the adaptive protection circuit module 100 and the operational amplifier 200 shown in FIG. 1. In step S700, the over current protection circuit 120 provides the current protection function for the operational amplifier 200 by limiting the output current of the operational amplifier 200. Next, the control signal Vadj is outputted to the over temperature protection circuit 110 to adjust the first threshold temperature T1 to the second threshold temperature T2 when the over current protection circuit 120 is enabled in step S710. Herein, the second threshold temperature T2 is lower than the first threshold temperature T1. Thereafter, in step S720, the over temperature protection circuit 110 provides the temperature protection function to power down the operational amplifier 200 when the operating temperature T of the operational amplifier 200 increases higher than the second threshold temperature T2. Next, the over temperature protection circuit 110 controls the operational amplifier 200 to release from the power-down state when the operating temperature T of the operational amplifier 200 decreases lower than the third threshold temperature T3 in step S730.

Besides, the adaptive protection method described in this embodiment of the invention is sufficiently taught, suggested, and embodied in the embodiments illustrated in FIG. 1 to FIG. 6, and therefore no further description is provided herein.

Figure 8:
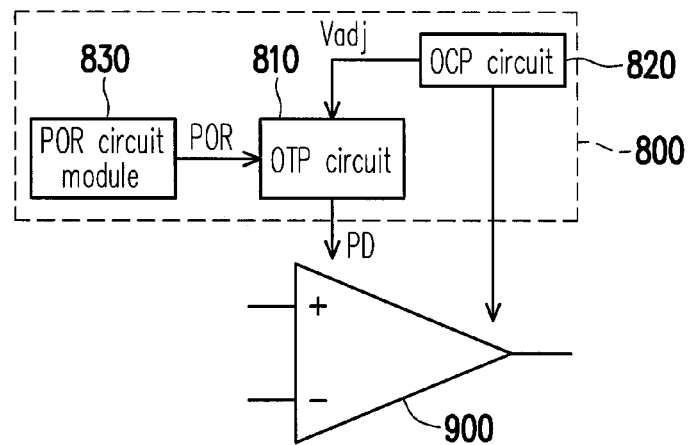
FIG. 8 illustrates a schematic diagram of an adaptive protection circuit module for an operational amplifier according to another embodiment of the invention.
Figure 9:
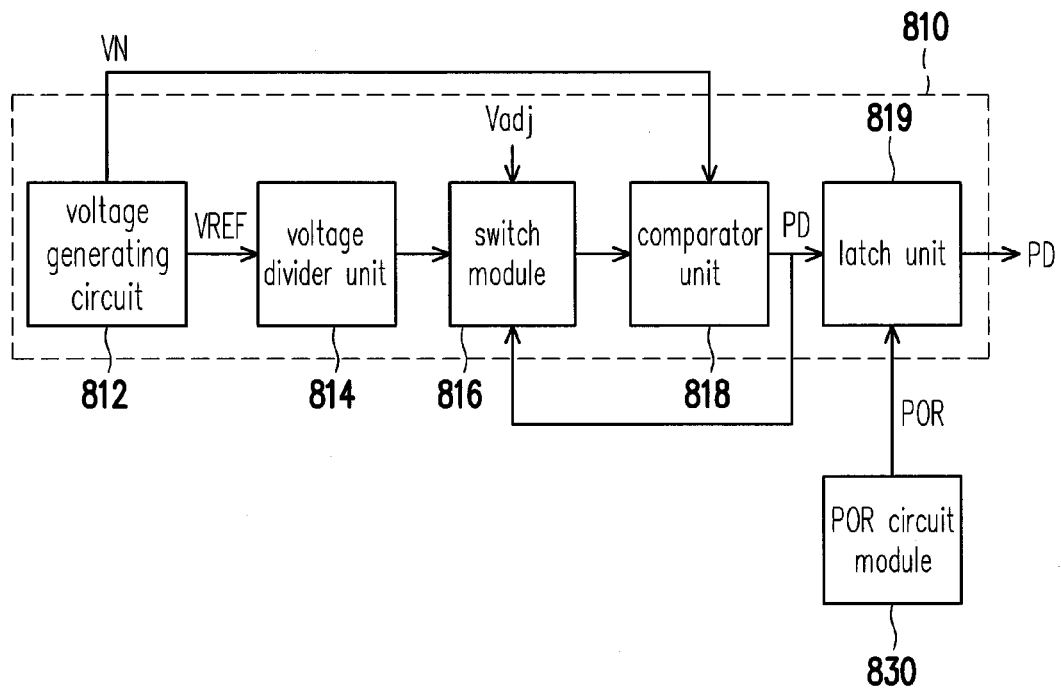
FIG. 9 illustrates a schematic block diagram of an over temperature protection circuit according to another embodiment of the invention.

FIG. 8 illustrates a schematic diagram of an adaptive protection circuit module for an operational amplifier according to another embodiment of the invention. FIG. 9 illustrates a schematic block diagram of an over temperature protection circuit according to another embodiment of the invention. Referring to FIG. 8 and FIG. 9, the adaptive protection circuit module 800 of the present embodiment is similar to the adaptive protection circuit module 100 except that the adaptive protection circuit module 800 further includes a power on reset (POR) circuit module 830. Furthermore, compared with the over temperature protection circuit 410, the over temperature protection circuit 810 further includes a latch unit 819. The latch unit 819 is coupled to the comparator unit 418 and latches the power down signal PD outputted from the comparator unit 418.

Figure 10:
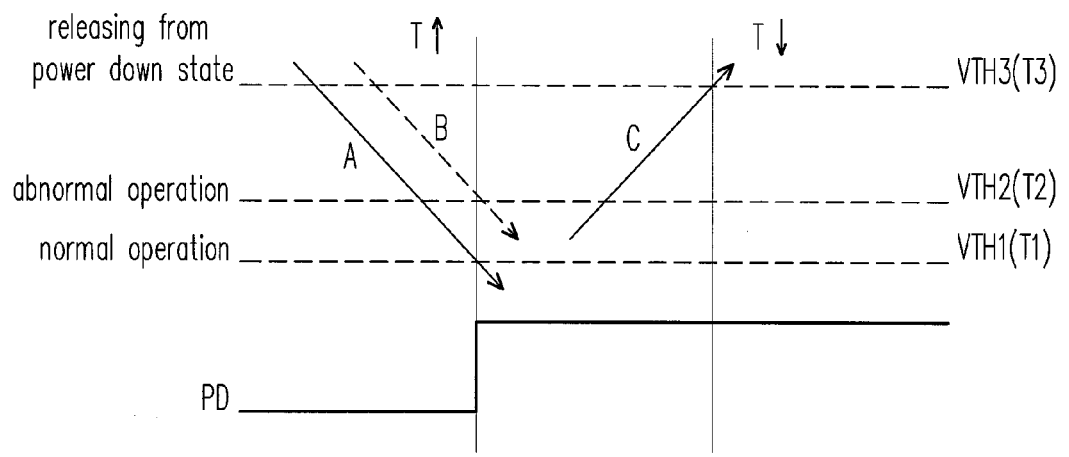
FIG. 10 illustrates a schematic waveform of the power down signal PD in different temperature according to another embodiment of the invention.

Specifically, FIG. 10 illustrates a schematic waveform of the power down signal PD in different temperature according to another embodiment of the invention. Referring to FIG. 10, in this embodiment even if the temperature sensitive voltage VN decreases lower than the third threshold voltage VTH3, the operational amplifier 900 still stays in the power-down state since the latch unit 819 latches the power down signal PD outputted from the comparator unit 418 and keeps it in the high level. In the present embodiment, the over temperature protection circuit 810 keeps the operational amplifier 900 in the power-down state until a power on sequence starts. The power on reset circuit module 830 provides a power on reset signal POR to reset the latch unit 819 during the power on sequence, so that the operational amplifier 900 releases from the power-down state. The power on reset circuit module 830 generates the power on reset signal POR during the power on sequence no matter what power slew rates, temperatures or process corners are.

Figure 11:
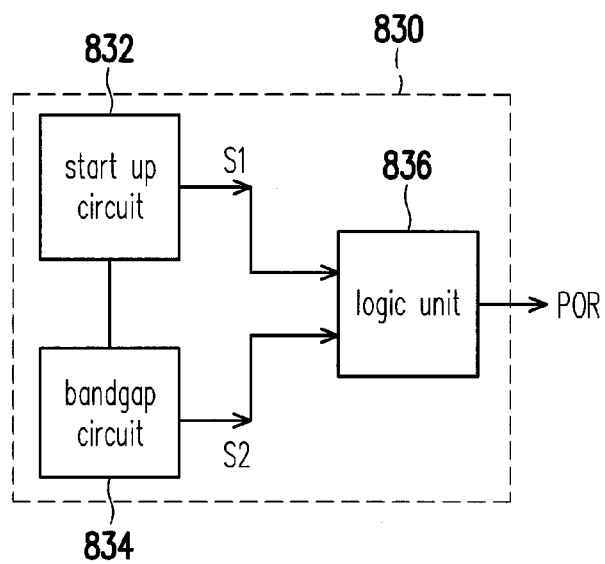
FIG. 11 illustrates a schematic block diagram of the power on reset circuit module according to an embodiment of the invention.

FIG. 11 illustrates a schematic block diagram of the power on reset circuit module according to an embodiment of the invention. Referring to FIG. 11, the power on reset circuit module 830 of the present embodiment includes a start up circuit 832, a bandgap circuit 834, and a logic unit 836. The start up circuit 832 provides a first reset voltage S1 to serve as the power on reset signal POR at a first temperature. The bandgap circuit 834 is coupled to the start up circuit 832. The bandgap circuit 834 provides a second reset voltage S2 to serve as the power on reset signal POR at a second temperature. The logic unit 836 is coupled to the start up circuit 832 and the bandgap circuit 834. The logic unit 836 outputs the first reset voltage S1 or the second reset voltage S2 to serve as the power on reset signal POR. In the present embodiment, the second temperature is higher than the first temperature.

Figure 12:
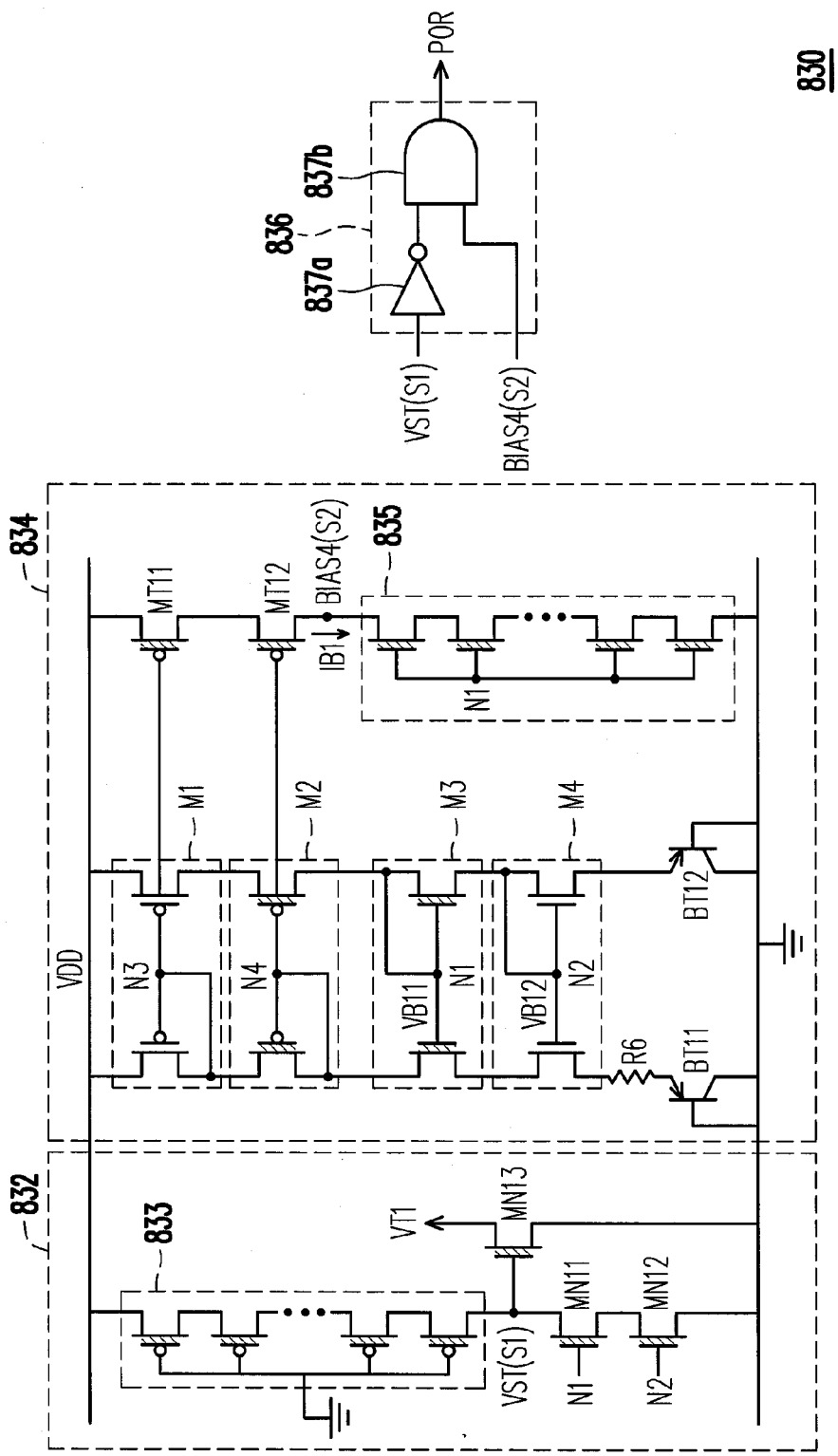
FIG. 12 illustrates a schematic circuit diagram of the power on reset circuit module in FIG. 11.

FIG. 12 illustrates a schematic circuit diagram of the power on reset circuit module in FIG. 11. Referring to FIG. 12, the bandgap circuit 834 includes a plurality of current mirrors M1 to M4, and the current mirrors M1 to M4 are connected in cascade with each other and have bias nodes N1 to N4. Moreover, the cascade current mirrors M1 to M4 are electrically connected to ground through bipolar transistors BT11 and BT12 and a resistor R6. In this way, the bandgap circuit 834 can map a bias current IB1 proportional to absolute temperature (PTAT) through P-channel transistors MT11 and MT12. Next, The bias current IB1 flows through a load unit 835 to generate a voltage BIAS4 which serves as the second reset voltage S2 and is transmitted to the logic unit 836. Based on experiments, the voltage BIAS4 has better electrical characteristics for resetting the latch unit 819 at a higher temperature such as 125° C.

To guarantee the bandgap circuit 834 to normally provide the bias current IB1, the start up circuit 832 is used to break the bandgap circuit 834 away from a zero-current state. During an operation, one of bias voltages VB11 and VB12 on the bias nodes N1 and N2 is transmitted to the start up circuit 832, and the start up circuit 832 determines whether or not to provide a start voltage VT1 to the bias node N3 or N4 according to a conducting state of an N-channel transistor MN13. The control voltage VST of the N-channel transistor MN13 serves as the first reset voltage S1 and is also transmitted to the logic unit 836. Based on experiments, the control voltage VST has better electrical characteristics for resetting the latch unit 819 at a lower temperature such as −25° C. or 50° C.

The logic unit 836 includes an inverter 837a and an AND gate 837b. The AND gate 837b has a first input terminal, a second input terminal, and an output terminal. The inverter 837a is coupled to the first input terminal of the AND gate 837b. The inverter 837a inverts the control voltage VST and then transmits it to the AND gate 837b. The second input terminal of the AND gate 837b receives the voltage BIAS4. The AND gate 837b performs an AND operation on the inverted control voltage VST and the voltage BIAS4 and outputs the power on reset signal POR at the output terminal. The power on reset circuit module 830 combines the control voltage VST and the voltage BIAS4 to generate the power on reset signal POR, such that the latch unit 819 can be certainly reset at different temperatures during the power on sequence.

Figure 13:
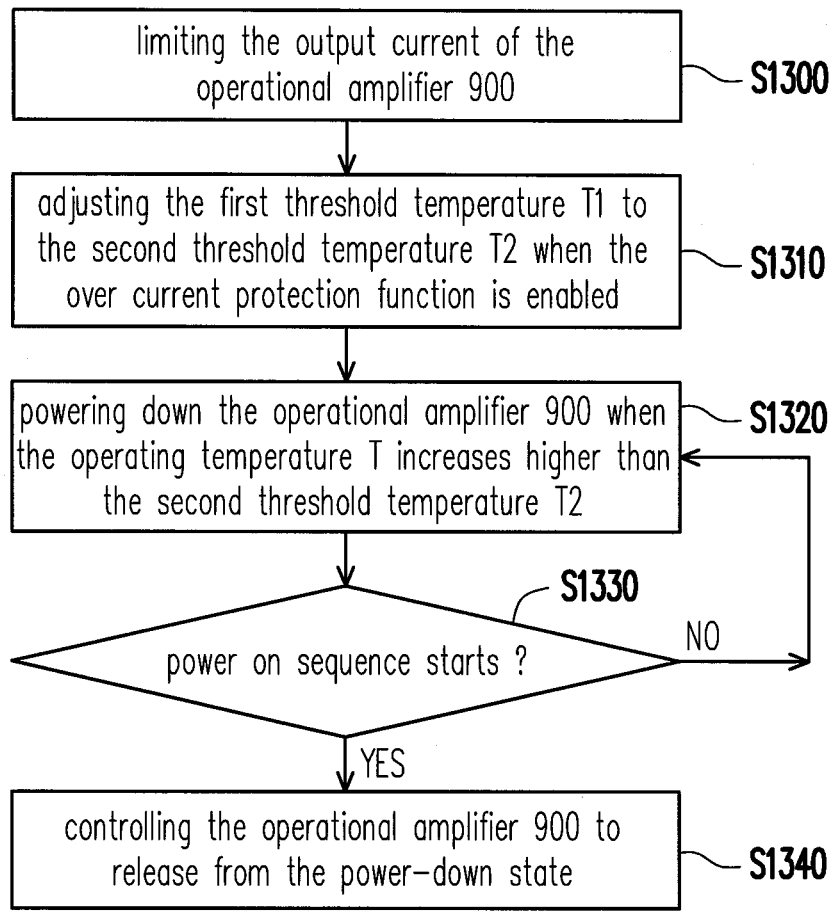
FIG. 13 illustrates a flowchart of an adaptive protection method for an operational amplifier according to another embodiment of the invention.

FIG. 13 illustrates a flowchart of an adaptive protection method for an operational amplifier according to another embodiment of the invention. Referring to FIG. 8 and FIG. 13, the adaptive protection method of the present embodiment may be adapted to the adaptive protection circuit module 800 and the operational amplifier 900 shown in FIG. 1. In step S1300, the over current protection circuit 820 provides the current protection function for the operational amplifier 900 by limiting the output current of the operational amplifier 900. Next, the control signal Vadj is outputted to the over temperature protection circuit 810 to adjust the first threshold temperature T1 to the second threshold temperature T2 when the over current protection circuit 120 is enabled in step S1310. Herein, the second threshold temperature T2 is lower than the first threshold temperature T1. Thereafter, in step S1320, the over temperature protection circuit 810 provides the temperature protection function to power down the operational amplifier 900 when the operating temperature T of the operational amplifier 900 increases higher than the second threshold temperature T2. Next, whether the power on sequence starts is confirmed in step S1330. If the power on sequence starts, the over temperature protection circuit 810 controls the operational amplifier 900 to release from the power-down state in step S1340. On the contrary, if the power on sequence does not start, the flow returns to step S1320, and the over temperature protection circuit 810 keeps the operational amplifier 900 in the power-down state until the power on sequence starts.

Besides, the adaptive protection method described in this embodiment of the invention is sufficiently taught, suggested, and embodied in the embodiments illustrated in FIG. 8 to FIG. 12, and therefore no further description is provided herein.

In summary, in the exemplary embodiments of the invention, the over current protection circuit adjusts the first threshold temperature to the second threshold temperature when the over current protection function is enabled. Accordingly, the over temperature protection circuit powers down the operational amplifier at a lower threshold temperature to provide a better temperature protection. Furthermore, the power on reset circuit module selects one of two different voltages to serve as the power on reset signal at different temperatures, such that the operational amplifier certainly releases from the power down state.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An adaptive protection circuit module for an operational amplifier, the adaptive protection circuit module comprising:

an over temperature protection circuit providing a temperature protection function to power down the operational amplifier when an operating temperature of the operational amplifier increases higher than a first threshold temperature; and an over current protection circuit providing a current protection function to limit an output current of the operational amplifier and adjusting the first threshold temperature to a second threshold temperature when the over current protection circuit is enabled, wherein after the first threshold temperature is adjusted to the second threshold temperature, the over temperature protection circuit powers down the operational amplifier when the operating temperature of the operational amplifier increases higher than the second threshold temperature, and the second threshold temperature is lower than the first threshold temperature, wherein the over temperature protection circuit keeps the operational amplifier in a power-down state until a power on sequence starts.

2. The adaptive protection circuit module as claimed in claim 1, wherein the over temperature protection circuit controls the operational amplifier to release from a power-down state when the operating temperature of the operational amplifier decreases lower than a third threshold temperature.

3. The adaptive protection circuit module as claimed in claim 2, wherein the over temperature protection circuit comprises:
   a voltage generating circuit providing a temperature sensitive voltage and a reference voltage, wherein the temperature sensitive voltage changes along with the operating temperature, and the reference voltage is temperature insensitive;
   a voltage divider unit coupled to the voltage generating circuit and dividing the reference voltage into a first threshold voltage, a second threshold voltage, and a third threshold voltage; and
   a comparator unit coupled to the voltage generating circuit and the voltage divider unit, comparing the temperature sensitive voltage with the first threshold voltage, the second threshold voltage, or the third threshold voltage, and outputting a power-down signal to power down the operational amplifier based on a comparison result.

4. The adaptive protection circuit module as claimed in claim 3, wherein the over temperature protection circuit further comprises:
   a switch module coupled between the voltage divider unit and the comparator unit and controlled by the over current protection circuit and the power-down signal to select and output the first threshold voltage, the second threshold voltage, or the third threshold voltage to the comparator unit.

5. The adaptive protection circuit module as claimed in claim 4, wherein the switch module is switched to select and output the first threshold voltage to the comparator unit when the operating temperature of the operational amplifier increases toward the first threshold temperature.

6. The adaptive protection circuit module as claimed in claim 4, wherein the switch module is switched to select and output the second threshold voltage to the comparator unit when the operating temperature of the operational amplifier increases toward the second threshold temperature.

7. The adaptive protection circuit module as claimed in claim 4, wherein the switch module is switched to select and output the third threshold voltage to the comparator unit when the operating temperature of the operational amplifier decreases toward the third threshold temperature.

8. The adaptive protection circuit module as claimed in claim 3, wherein the temperature sensitive voltage has a negative temperature coefficient.

9. The adaptive protection circuit module as claimed in claim 1, wherein the over temperature protection circuit controls the operational amplifier to release from the power-down state when the power on sequence starts.

10. The adaptive protection circuit module as claimed in claim 1, wherein the over temperature protection circuit powers down the operational amplifier by a power down signal, and the over temperature protection circuit comprises a latch unit to latch the power down signal.

11. The adaptive protection circuit module as claimed in claim 10, further comprising:
   a power on reset circuit module providing a power on reset signal to reset the latch unit, so that the over temperature protection circuit controls the operational amplifier to release from the power-down state.

12. The adaptive protection circuit module as claimed in claim 11, wherein the power on reset circuit module comprises:
   a start up circuit providing a first reset voltage to serve as the power on reset signal at a first temperature;
   a bandgap circuit coupled to the start up circuit and providing a second reset voltage to serve as the power on reset signal at a second temperature; and
   a logic unit coupled to the start up circuit and the bandgap circuit and outputting the first reset voltage or the second reset voltage to serve as the power on reset signal.

13. The adaptive protection circuit module as claimed in claim 12, wherein the second temperature is higher than the first temperature.

14. An adaptive protection method for an operational amplifier, the adaptive protection method comprising:
   providing a current protection function to limit an output current of the operational amplifier;
   providing a temperature protection function to power down the operational amplifier when an operating temperature of the operational amplifier increases higher than a first threshold temperature;
   adjusting the first threshold temperature to a second threshold temperature when the over current protection function is enabled, wherein the second threshold temperature is lower than the first threshold temperature, and
   keeping the operational amplifier in a power-down state until a power on sequence starts,
   wherein after the first threshold temperature is adjusted to the second threshold temperature, in the step of providing the temperature protection function, powering down the operational amplifier when the operating temperature of the operational amplifier increases higher than the second threshold temperature.

15. The adaptive protection method as claimed in claim 14, further comprising:
   controlling the operational amplifier to release from a power-down state when the operating temperature of the operational amplifier decreases lower than a third threshold temperature.

16. The adaptive protection method as claimed in claim 14, further comprising:
   controlling the operational amplifier to release from the power-down state when the power on sequence starts.

* * * * *